(12) United States Patent
Lind

(10) Patent No.: US 8,485,822 B2
(45) Date of Patent: Jul. 16, 2013

(54) SIMULATION SYSTEM IMPLEMENTING HISTORICAL MACHINE DATA

(75) Inventor: Jeffrey D. Lind, Naperville, IL (US)

(73) Assignee: Caterpillar Inc., Peoria, IL (US)

( * ) Notice: Subject to any disclaimer, the term of this patent is extended or adjusted under 35 U.S.C. 154(b) by 921 days.

(21) Appl. No.: 11/443,316

(22) Filed: May 31, 2006

(65) Prior Publication Data
US 2007/0282577 A1    Dec. 6, 2007

(51) Int. Cl.
    *G09B 9/02* (2006.01)
(52) U.S. Cl.
    USPC .......... 434/29; 37/347; 37/348; 37/366; 37/379; 37/411; 273/400; 434/62; 434/63; 434/64; 434/65; 434/66; 434/69; 701/1; 701/24; 701/29.1; 701/36; 701/50; 701/400; 701/408; 703/6; 703/13
(58) Field of Classification Search
    USPC ............ 434/29, 62, 63, 64, 65, 66, 69; 703/6, 703/13; 701/29, 35, 1, 24, 29.1, 36, 50, 400, 701/408; 37/347, 348, 366, 379, 411; 273/400
    See application file for complete search history.

(56) References Cited

U.S. PATENT DOCUMENTS

| | | | | |
|---|---|---|---|---|
| 4,041,283 A * | 8/1977 | Mosier | .......... | 701/20 |
| 4,373,856 A * | 2/1983 | Taylor | .......... | 414/470 |
| 4,599,070 A * | 7/1986 | Hladky et al. | .......... | 434/45 |
| 4,635,739 A * | 1/1987 | Foley et al. | .......... | 177/45 |
| 4,750,888 A * | 6/1988 | Allard et al. | .......... | 434/69 |
| 4,827,438 A * | 5/1989 | Nickles et al. | .......... | 703/8 |
| 4,979,137 A * | 12/1990 | Gerstenfeld et al. | .......... | 703/8 |
| 5,147,206 A * | 9/1992 | Golenski | .......... | 434/219 |
| 5,183,369 A * | 2/1993 | Warren et al. | .......... | 414/339 |
| 5,277,584 A * | 1/1994 | DeGroat et al. | .......... | 434/29 |
| 5,320,474 A * | 6/1994 | Warren et al. | .......... | 414/339 |
| 5,342,159 A * | 8/1994 | Warren et al. | .......... | 414/339 |
| 5,354,202 A * | 10/1994 | Moncrief et al. | .......... | 434/69 |
| 5,412,569 A * | 5/1995 | Corby et al. | .......... | 701/2 |
| 5,415,549 A * | 5/1995 | Logg | .......... | 434/38 |
| 5,474,453 A * | 12/1995 | Copperman | .......... | 434/29 |
| 5,616,031 A * | 4/1997 | Logg | .......... | 434/38 |
| 5,618,179 A * | 4/1997 | Copperman et al. | .......... | 434/69 |
| 5,706,195 A * | 1/1998 | Corby et al. | .......... | 701/2 |
| 5,857,855 A * | 1/1999 | Katayama | .......... | 434/247 |
| 5,865,624 A * | 2/1999 | Hayashigawa | .......... | 434/66 |
| 5,904,484 A * | 5/1999 | Burns | .......... | 434/252 |
| 5,953,977 A * | 9/1999 | Krishna et al. | .......... | 91/361 |
| 6,033,226 A * | 3/2000 | Bullen | .......... | 434/219 |
| 6,094,625 A * | 7/2000 | Ralston | .......... | 702/150 |
| 6,108,949 A * | 8/2000 | Singh et al. | .......... | 37/414 |
| 6,126,449 A * | 10/2000 | Burns | .......... | 434/252 |

(Continued)

OTHER PUBLICATIONS

CBS, "Shovel Snow the Right Way", Aug. 6, 2004, www.cbsnews.com, pp. 1-12.*

*Primary Examiner* — Jack Yip
(74) *Attorney, Agent, or Firm* — Finnegan, Henderson, Farabow, Garrett & Dunner, LLP

(57) ABSTRACT

A simulation system for a machine is disclosed. The simulation system has a user interface configured to display a simulated environment, and a controller in communication with the user interface. The controller is configured to receive historical information related to performance of a machine, and recreate a past operation of the machine from the received historical information. The controller is also configured to provide to the user interface the recreated past operation for display in the simulated environment.

20 Claims, 4 Drawing Sheets

U.S. PATENT DOCUMENTS

| | | | |
|---|---|---|---|
| 6,164,973 A * | 12/2000 | Macri et al. | 434/247 |
| 6,223,110 B1 * | 4/2001 | Rowe et al. | 701/50 |
| 6,363,173 B1 * | 3/2002 | Stentz et al. | 382/195 |
| 6,363,632 B1 * | 4/2002 | Stentz et al. | 37/414 |
| 6,514,081 B1 * | 2/2003 | Mengoli | 434/252 |
| 6,633,800 B1 * | 10/2003 | Ward et al. | 701/2 |
| 6,837,528 B1 * | 1/2005 | Britt | 294/49 |
| 6,863,002 B2 * | 3/2005 | Vida | 105/404 |
| 7,095,423 B2 * | 8/2006 | Cosman et al. | 345/629 |
| 7,096,171 B2 * | 8/2006 | Hawthorne et al. | 703/8 |
| 7,127,325 B2 * | 10/2006 | Nagata et al. | 700/245 |
| 7,246,047 B2 * | 7/2007 | Ghaboussi et al. | 703/2 |
| 7,264,554 B2 * | 9/2007 | Bentley | 473/222 |
| 7,403,826 B2 * | 7/2008 | Aghili et al. | 700/28 |
| 7,457,698 B2 * | 11/2008 | Danko | 701/50 |
| 7,650,267 B1 * | 1/2010 | Sturrock et al. | 703/6 |
| 7,688,016 B2 * | 3/2010 | Aghili | 318/568.11 |
| 2001/0029411 A1 * | 10/2001 | Hawthorne | 701/19 |
| 2003/0120472 A1 * | 6/2003 | Lind | 703/13 |
| 2003/0216895 A1 * | 11/2003 | Ghaboussi et al. | 703/2 |
| 2004/0017385 A1 * | 1/2004 | Cosman et al. | 345/629 |
| 2004/0133315 A1 * | 7/2004 | Kumar et al. | 700/302 |
| 2004/0158355 A1 * | 8/2004 | Holmqvist et al. | 700/245 |
| 2004/0158476 A1 * | 8/2004 | Blessinger et al. | 705/1 |
| 2004/0267404 A1 * | 12/2004 | Danko | 700/245 |
| 2005/0065682 A1 * | 3/2005 | Kapadia et al. | 701/35 |
| 2005/0081410 A1 | 4/2005 | Furem et al. | |
| 2005/0177292 A1 * | 8/2005 | Okamura et al. | 701/50 |
| 2006/0166737 A1 * | 7/2006 | Bentley | 463/30 |
| 2007/0020588 A1 * | 1/2007 | Batcheller et al. | 434/30 |

* cited by examiner

SIMULATION SYSTEM IMPLEMENTING HISTORICAL MACHINE DATA

TECHNICAL FIELD

This disclosure relates generally to a simulation system and, more particularly, to a system that uses previously recorded performance data to simulate past operation of a machine and recommend related training exercises.

BACKGROUND

Machines such as, for example, construction equipment, passenger vehicles, vocational trucks, and other machines known in the art are used for a variety of purposes. Before, during, and after operation of these machines, it may be important to know or predict the performance of the machines and their operators. However, depending on the type of the machine, size of the machine, cost of the machine, and/or the current application and location of the machine, this information may be difficult and expensive to access.

One solution to this problem that has been implemented by machine manufacturers is described in U.S. Patent Publication No. 2003/0120472 (the '472 publication) by Lind published on Jun. 26, 2003. The '472 publication describes a process for simulating one or more components for a user. The process includes creating an engineering model of a component, receiving from the user selection data for configuring the component, and creating a web-based model of the component based on the selection data and the engineering model. The process further includes providing a simulation of the web-based model in a simulation environment and providing to the user feedback data reflecting characteristics of the web-based model during the simulation.

Although the process of the '472 publication may allow a user to operate the configured component in a simulated environment to predict how the component might function, it does not provide a glimpse of past or current actual component performance or information regarding historical operator control of the component. Without knowing or being able to visualize how the component has been or is currently being used, it may be difficult to analyze past performance of the machine or it's operator, or make improvement recommendations to machine operators.

The system of the present disclosure is directed towards overcoming one or more of the problems as set forth above.

SUMMARY OF THE INVENTION

In accordance with one aspect, the present disclosure is directed toward a machine simulation system. The machine simulation system includes a user interface configured to display a simulated environment, and a controller in communication with the user interface. The controller is configured to receive historical information related to performance of a machine, and recreate a past operation of the machine from the received historical information. The controller is further configured to provide to the user interface the recreated past operation for display in the simulated environment.

According to another aspect, the present disclosure is directed toward a method of improving machine operation. The method includes receiving historical information related to performance of the machine, and recreating a past operation of the machine from the received historical information. The method also includes displaying the recreated past operation in a simulated environment.

DETAILED DESCRIPTION

Figure 1:
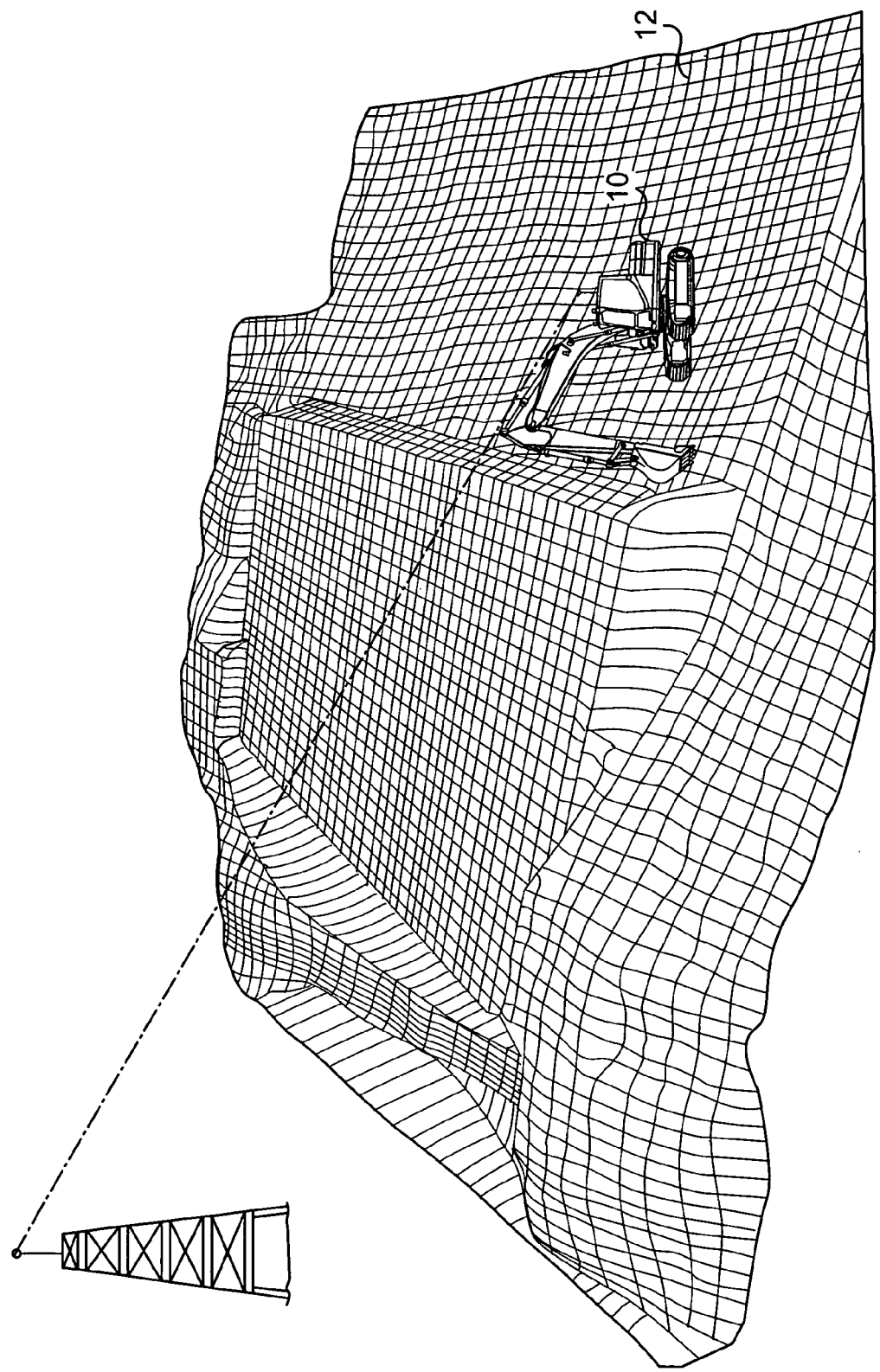
FIG. 1 is a pictorial illustration of an exemplary disclosed machine traveling about a worksite.

FIG. 1 illustrates an exemplary machine 10 performing a predetermined function at a worksite 12. Machine 10 may embody a stationary or mobile machine, with the predetermined function being associated with a particular industry such as mining, construction, farming, transportation, power generation, or any other industry known in the art. For example, machine 10 may be an earth moving machine such as the excavator depicted in FIG. 1, in which the predetermined function includes the removal of earthen material from worksite 12 that alters the geography of worksite 12 to an architecturally desired form. Machine 10 may alternatively embody a different earth moving machine such as a motor grader or a wheel loader, or a non-earth moving machine such as a passenger vehicle, a stationary generator set, or a pumping mechanism. Machine 10 may embody any suitable operation-performing machine.

Figure 2:
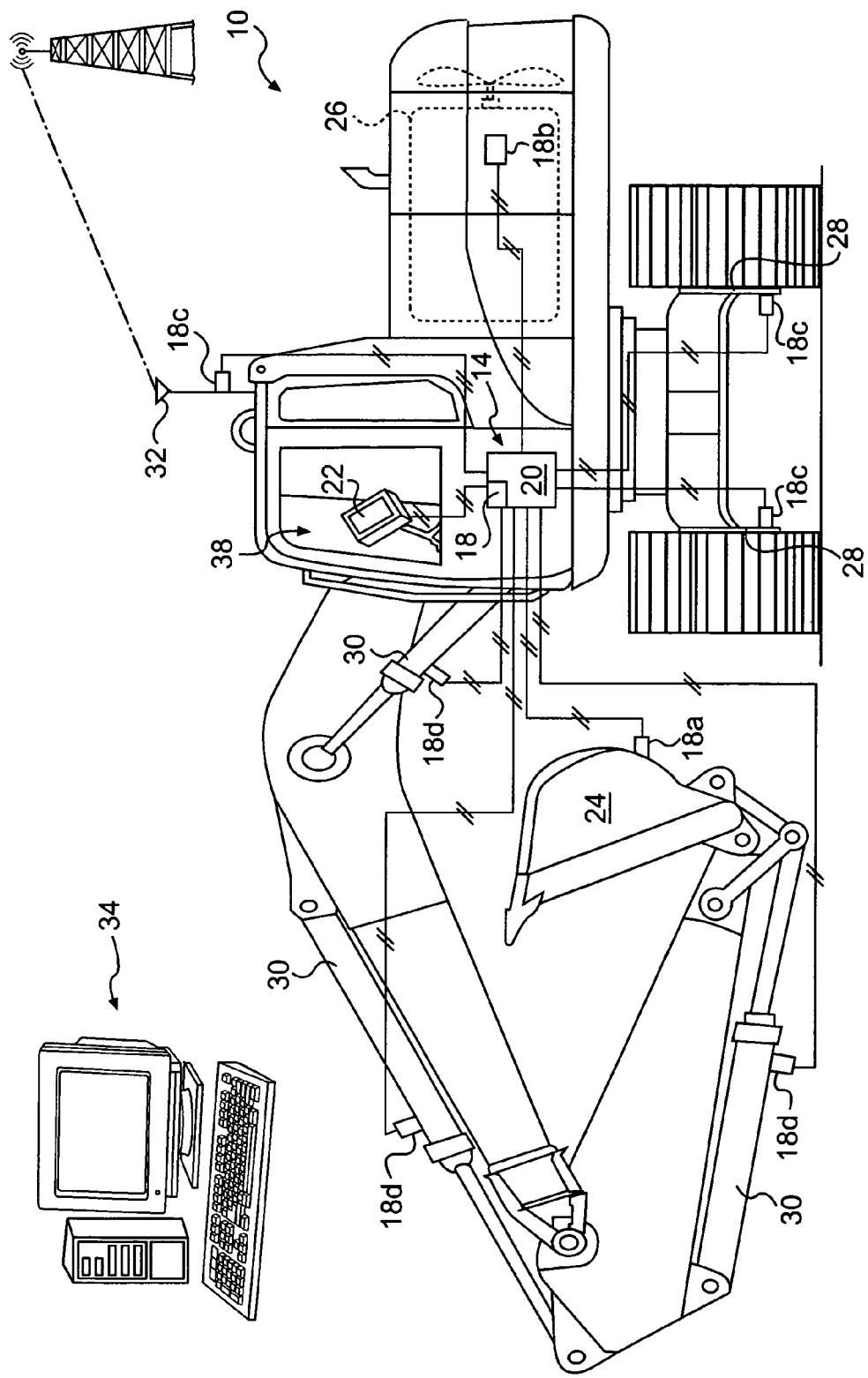
FIG. 2 is a schematic and diagrammatic illustration of an exemplary disclosed machine simulation system for use with the machine of FIG. 1.

As illustrated in FIG. 2, machine 10 may include a simulation system 14 having multiple components that interact to monitor the operation of machine 10 and perform analysis in response thereto. In particular, machine 10 may include a data module 18, a controller 20, and a display system 22. It is contemplated that any one or all of data module 18, controller 20, and display system 22 may be integrated in a single unit, if desired. It is further contemplated that simulation system 14 may include additional or different components than those illustrated in FIG. 2.

Data module 18 may include a plurality of sensing devices 18a-e distributed throughout machine 10 to gather data from various components and systems of machine 10. Sensing devices 18a-e may be associated with, for example, operator input device, a work tool 24, a power source 26, a transmission device 28, one or more hydraulic devices 30, a position locating device 32, a torque converter (not shown), a fluid supply (not shown), and/or other systems and components of machine 10. These sensing devices 18a-e may automatically gather data from machine 10 such as operator manipulation of the input devices, tool, power source, and/or machine velocity and location; fluid pressure, flow rate, temperature, contamination level, and/or viscosity; electric current and/or voltage levels; fluid (i.e., fuel, oil, water, etc.) consumption rates; loading levels (i.e., payload value, percent of maximum allowable payload limit, payload history, payload distribution, etc.); transmission output ratio; cycle time; idle time, grade; recently performed maintenance and/or repair operations; and other such pieces of information. Additional information may be generated or maintained by machine data module 18 such as the date, time of day, and operator information. The gathered data may be indexed relative to the time, day, date, operator, or other pieces of information to trend the various operational aspects of machine 10, if desired.

Controller 20 may be in communication with data module 18 and include any means for monitoring, recording, storing, indexing, processing, and/or communicating the operational aspects of machine 10 described above. These means may include components such as, for example, a memory, one or more data storage devices, a central processing unit, or any other components that may be used to run an application. Furthermore, although aspects of the present disclosure may be described generally as being stored in memory, one skilled in the art will appreciate that these aspects can be stored on or read from different types of computer program products or computer-readable media such as computer chips and secondary storage devices, including hard disks, floppy disks, flash drives, optical media, CD-ROM, or other forms of RAM or ROM.

Controller 20 may further include a means for communicating with an offboard system 34. For example, controller 20 may include hardware and/or software that enables sending and receiving of data messages through a direct data link (not shown) or a wireless communication link (not shown). The wireless communications may include satellite, cellular, infrared, and any other type of wireless communications that enable controller 20 to exchange information. It is contemplated that a separate module may alternatively be included within simulation system 14 to facilitate the communication of data between controller 20 and offboard system 34, if desired.

Offboard system 34 may represent one or more receiving, computing, and/or display systems of a business entity associated with machine 10, such as a manufacturer, dealer, retailer, owner, service provider, or any other entity that generates, maintains, sends, and/or receives information associated with machine 10. The one or more computing systems may include, for example, a machine simulator, a mainframe, a work station, a laptop, a personal digital assistant, and other computing systems known in the art.

Figure 3:
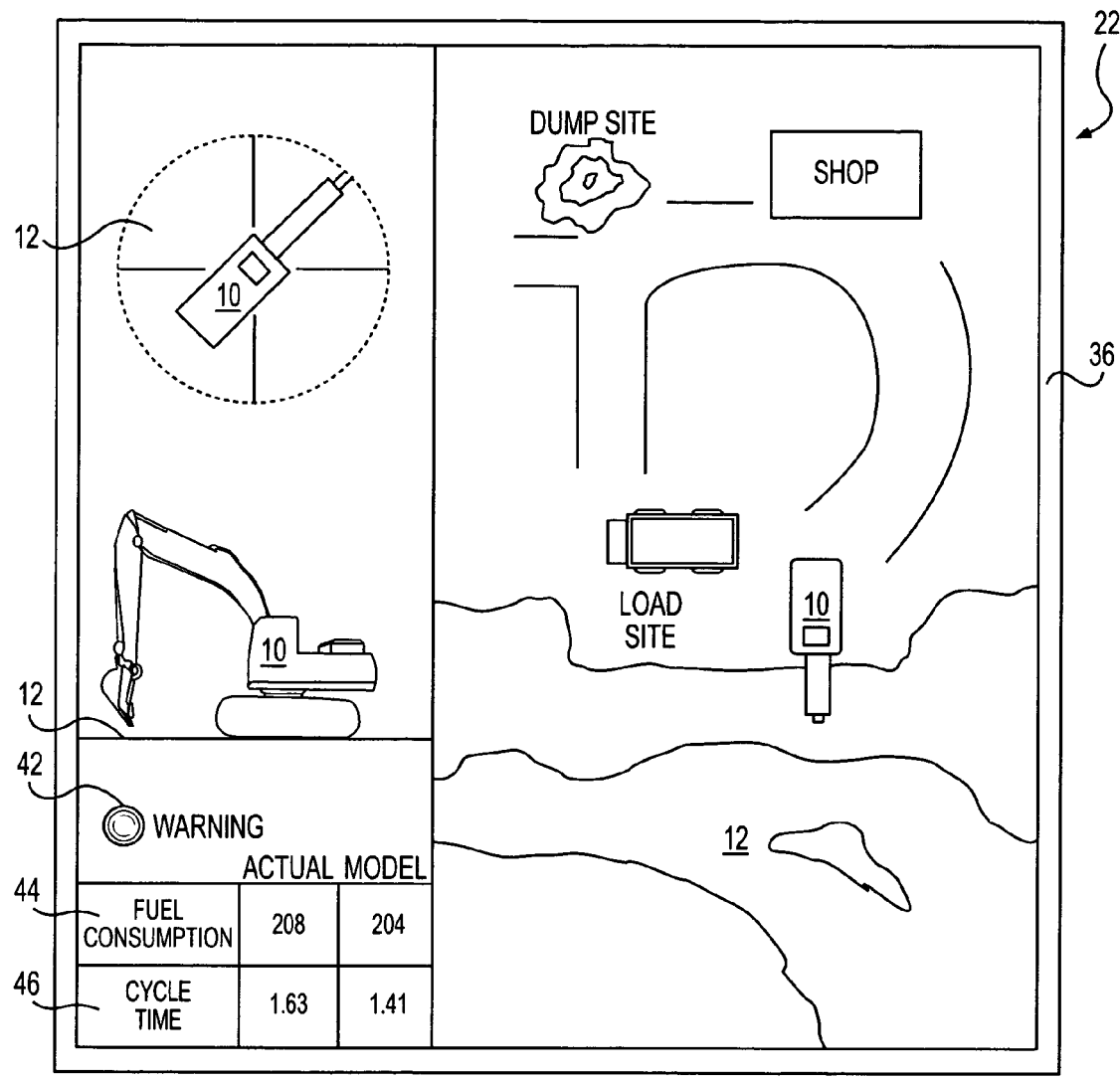
FIG. 3 is a diagrammatic illustration of an exemplary disclosed onboard display for use with the machine of FIG. 1.

As illustrated in FIG. 3, display system 22 may provide to an operator of machine 10 an onboard visual indication of the performance of machine 10. For example, display system 22 may be configured to receive from controller 20 position, orientation, and/or velocity information associated with the movement of machine 10 and/or work tool 24 relative to worksite 12, and graphically display this information. In one example, display system 22 may embody a monitor 36 located within an operator station 38 of machine 10 (referring to FIG. 1). Monitor 36 may receive the information from controller 20 and display a real time location of machine 10 and/or work tool 24 relative to worksite 12, and one or more efficiency warnings and measures. In one exemplary embodiment, monitor 36 may include an efficiency warning lamp 42, a fuel consumption readout 44, and a cycle time readout 46. It is contemplated that different or additional efficiency warnings and/or measures may be included within display system 22, if desired.

As also illustrated in FIG. 3, display system 22 may provide to the operator of machine 10 a visual indication of a previous performance of machine 10 or other similarly-equipped machine. That is, controller 20 may be configured to recognize, from the operational information collected by data module 18, a particular category of machine operation such as, for example, loading, digging, grading, or other suitable operation, and retrieve from the memory of controller 20 previously recorded machine data associated with a similar, previously performed operation. This recorded information may correspond with optimal control of machine 10 and be used to recreate an optimal operation for display, comparison, and training purposes on monitor 36. For the best possible accuracy, the previously recorded data should correspond with the same machine 10 operating at the same worksite 12, even though information from similar machines and similar worksites may be successfully utilized.

If efficiency measures associated with the comparison operation significantly exceed the same efficiency measures associated with the current operation of machine 10, controller 20 may activate warning lamp 42, thereby recommending training to the operator of machine 10. That is, if the current operation of machine 10 significantly deviates from the optimal operation of machine 10 stored within the memory of controller 20, it can be determined that the current operator requires training to improve his/her control of machine 10. Upon acceptance of the recommended training, controller 20 may display upon monitor 36 the previously performed and recorded optimal operation of machine 10 back-to-back or simultaneously with the just performed operation of machine 10. It is contemplated that the training may be recommended to the operator of machine 10 in ways other than through the use of warning lamp 42 such as, for example, through an audible tone or message sounded within operator station 38, through a written message appearing on monitor 36 or other display apparatus within operator station 38, or in another similar manner. As the operator views the previously performed machine operation via monitor 36 before, during, or after his/her self-performed operation, changes to the operator's control technique may be visually discerned by the operator and/or pointed out by controller 20 during the training simulation.

There may be situations in which immediate training simulation is inconvenient. In these situations, it may be possible for offboard system 34 to receive from controller 20 the collected operational data of machine 10 corresponding to the just performed operation and the previously performed optimal operation, and recreate a simulation environment offboard machine 10. The recreated simulation environment may then be displayed on one or more surfaces of offboard system 34 in 2-D or 3D fashion. In this manner, life-like high-quality training may be carried out without unduly interrupting the operation of machine 10.

Figure 4A:
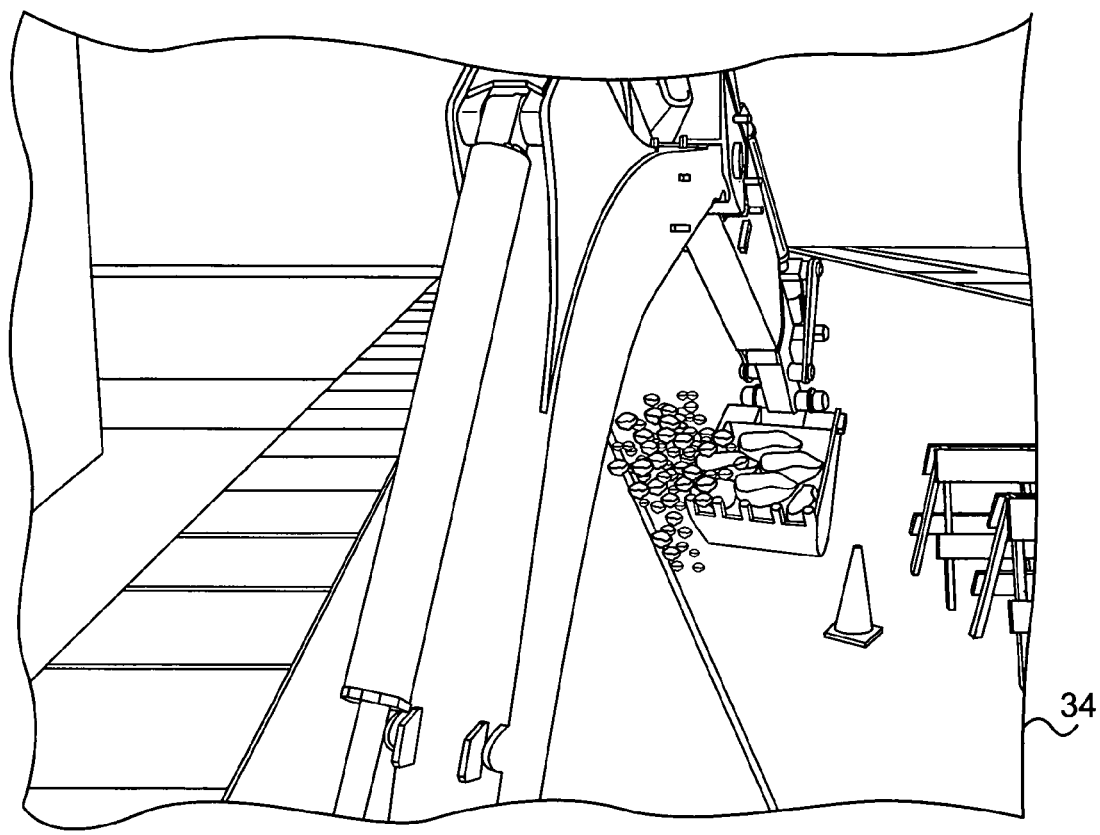
FIG. 4A is a pictorial illustration of an exemplary disclosed offboard display associated with the machine of FIG. 1.
Figure 4B:
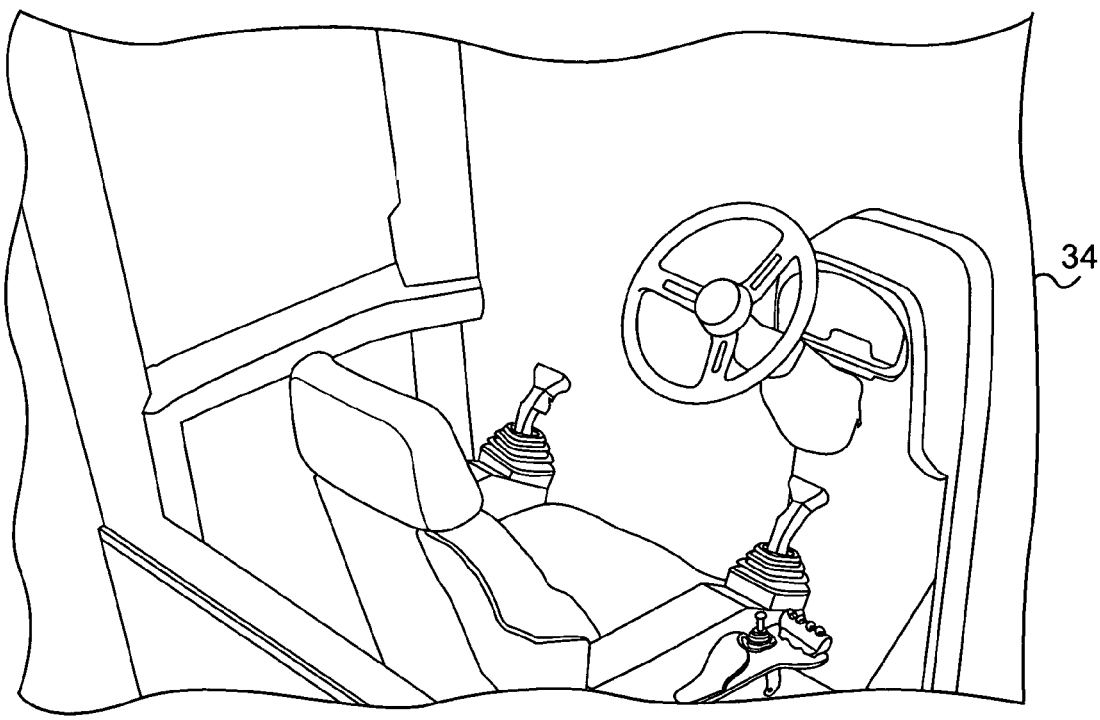
FIG. 4B is a pictorial illustration of another exemplary disclosed offboard display associated with the machine of FIG. 1.

For example, at an operator's leisure, the two sequences of events (e.g., the self-performed operation and the corresponding optimal operation) may be displayed by offboard system 34 from a number of operator selectable reference viewpoints. One viewpoint may correspond with a high level view of machine 10 as it moves about worksite 12, and may resemble the image of FIG. 1. In fact, it is contemplated that actual satellite images may be utilized to simulate machine performance about worksite 12, if desired. From this viewpoint, an operator may discern, for example, if an optimal travel route, transmission gear, or travel speed was correctly utilized, or if an approach to a work pile or other cooperating machine was appropriate to maximize efficiency. A second viewpoint may correspond with a close look at work tool movement from inside or outside of operator station 38, and may resemble the image of FIG. 4A. From this viewpoint, an operator may determine, among other things, if work tool placement produced maximum loading, if work tool movement minimized power loss, or if the resultant terrain of worksite 12 is compatible with a desired terrain or subsequent excavation passes. A third viewpoint may correspond with the inside of operator station 38, and may resemble the image of FIG. 4B. From this viewpoint, an operator may determine if hand movement between actuator devices was timely, or if a sequence of device actuation resulted in the desired excavation contour.

It is contemplated that offboard system 34 may include an interface resembling that of operator station 38. In particular, offboard system 34 may include the same or similar actuation devices (not shown) such as, for example, steering wheels, joysticks, pedals, and other known devices typically found within operation station 38 of machine 10. Offboard system 34 may provide a practice simulation environment that incorporates historical machine data and allows operator input for purposes of improving machine control. In this manner, novice operators may be trained without compromising the function or safety of work machine 10, other equipment at worksite 12, him/herself, or other worksite personnel.

It is further contemplated that offboard system 34 may include a database (not shown) of historical information indexed by machine type, worksite type, worksite location, environmental conditions (e.g., dry, wet, icy, etc.), time of day, and other such parameters. An operator undergoing training may then select from these parameters particular conditions and therewith compare the difference in machine operation and performance. For example, an operator may select to train with a large wheel loader at a particular quarry during rainy conditions late in the day. The operator may then select to train with a medium wheel loader at the same quarry during dry conditions early in the day, to see how machine operation may differ. From this comparison, an operator may be able to discern techniques applicable to the specific locations, machine, or times of day.

In addition, it is contemplated that multiple user simulation may be provided by offboard system 34. In particular, a first user may select for training a wheel loader, while a second user may select a haul truck. The two users may then undergo interactive training to experience how the two machines may optimally cooperate. Fleet manages may use offboard system 34 in this manner to foster competition among operators or to visualize how well particular machines or operators cooperate at a common worksite. To utilize this function, multiple offboard systems 34 may be utilized and connected to each other by way of direct communication links, telephone lines, internet connections, or other means known in the art.

INDUSTRIAL APPLICABILITY

The disclosed system may be applicable to any machine where efficient control of the machine is important, and immediate access to the machine is difficult, time consuming, or expensive. In particular, the disclosed system may provide onboard and offboard simulation environments where historical operations of the machine may be recreated for evaluation and training purposes. Operation of simulation system 14 will be described.

As machine 10 is operated to perform a task about worksite 12, controller 20 may record signals produced by data module 18. For example, as machine 10 is operated to force work tool 24 into a surface of worksite 12, the various sensing devices 18a-e of data module 18 may track the movements of machine 10, the actuation of hydraulic devices 30, the articulation of work tool 24, the speed of work tool 24, the weight or volume of material removed by work tool 24, the resulting excavation contour, the operator inputs to various actuation devices within operator station 38, the fuel consumption of power source 26, and other similar work machine operating parameters. These parameters may be stored within the memory of controller 20 for later comparison and simulation.

As controller 20 stores these parameters, it may also compare the stored parameters with previously recorded performance parameters to find a corresponding optimal operation. Continuing with the example from above, according to the specific sequence of operational events, loading information, operator input, etc., controller 20 may classify the current operation of machine 10 as a digging operation and search within the memory of controller 20 for a corresponding optimal digging operation.

Once a corresponding optimal operation has been found, a comparison to the current operation may be made to determine if operator training is required. In other words, if the current operation is being performed at an efficiency level significantly less than the corresponding optimal operation, the current operator may need training specific to the current particular operation. This determination may be made by comparing efficiency measures such as fuel consumption or cycle time between the corresponding operations. If it is determined that training is required, controller 20 may signal to the operator of machine 10 the availability of training.

Upon acceptance of the available training, controller 20 may recreate the just performed operation and the optimal operation for display on monitor 36. The two recreated operations may be displayed back-to-back or simultaneously to illustrate to the operator of machine 10 differences between the operations that can result in improved efficiency. By displaying the two operations with their associated efficiency measures, the operator may discern and/or controller 20 may point out those operator actions where the most improvement can be achieved. In addition, the difference in magnitude between the efficiency measures may provide motivation for the operator to adjust control techniques.

If immediate simulation of the two operations is inappropriate, the collected data and/or the recreations may be send to offboard system 34 for display in a separate, more elaborate simulation environment. In this environment, onboard and offboard lifelike views may be displayed in two and/or three dimensions to illustrate machine, work tool, and operator movements. In addition, the operator may be able to interact with the simulation environment via one or more input devices, similar to those found onboard machine 10.

Because historical data may be used to recreate and simulate past operations of machine 10, the training experienced by the operator may be extensive. In particular, because an operator may view self-performed operations, the operator may directly discern which personal operating techniques need improvement. In addition, because the operator may compare these self-performed operations to optimal operations that were actually performed on the same machine, the goal of improved machine control may seem more attainable to the operator, as compared to theoretical optimal performances. In addition, because the training may be recommended and available immediately, improvement in machine control may likewise be immediate.

It will be apparent to those skilled in the art that various modifications and variations can be made to the method and system of the present disclosure. Other embodiments of the method and system will be apparent to those skilled in the art from consideration of the specification and practice of the method and system disclosed herein. For example, it is contemplated that, as an operator's control of machine 10 exceeds the recorded optimal performance of machine 10, the just performed operation may replace the optimal performance within the memory of controller 20 for future comparison purposes. It is intended that the specification and examples be considered as exemplary only, with a true scope of the disclosure being indicated by the following claims and their equivalents.

What is claimed is:

1. A machine simulation system, comprising:
    a user interface configured to display a simulated environment; and
    a controller in communication with the user interface, the controller having a stored first example of operation of a machine work tool to perform a task, the controller being configured to:
        receive historical information related to performance of the machine work tool, the machine work tool being adapted to perform at least one of loading, digging, and grading at a worksite;
        recreate a past manual operation of the machine work tool by a first operator of the machine work tool from the received historical information, the past manual operation of the machine work tool being a second example of operation of the machine work tool to perform the task;
        provide to the user interface the first example of the operation of the machine work tool for display in the simulated environment;
        communicate via the user interface that the first example of the operation of the machine work tool represents a preferred way to perform the task compared to the second example of operation of the machine work tool by the first operator;
        analyze the recreated past operation and recognize a need for operator improvement based on the analysis of the recreated past operation; and
        provide to the user interface:
            the second example of the operation of the machine work tool to enable the first operator to visualize differences between the first operator's manual operation of the machine work tool to perform the task, as represented by the second example of the operation of the machine work tool, and the preferred operation of the machine work tool to perform the task, as represented by the first example of the operation of the machine work tool; and
            results of an analysis as to whether an actual terrain of the worksite is compatible with a desired terrain of the worksite.

2. The machine simulation system of claim 1, wherein the analysis of the recreated past manual operation includes a comparison of the first past manual operation to a second past manual operation.

3. The machine simulation system of claim 1, wherein the controller is further configured to recommend a training simulation for the first operator based on the recognized need for operator improvement.

4. The machine simulation system of claim 3, wherein the controller is further configured to provide the user interface with the training simulation for display in the simulated environment.

5. The machine simulation system of claim 1, wherein the simulated environment includes a plurality of selectable reference viewpoints.

6. The machine simulation system of claim 5, wherein a first of the plurality of selectable reference viewpoints is from inside of an operator cabin of a machine looking toward the machine work tool.

7. The machine simulation system of claim 6, wherein a second of the plurality of selectable reference viewpoints is from inside of the operator cabin looking toward one or more operator controls of the machine.

8. The machine simulation system of claim 7, wherein a third of the plurality of selectable reference viewpoints is from a predetermined distance outside of the operator cabin looking toward the machine.

9. The machine simulation system of claim 1, further including a machine data module located on a machine and configured to collect the historical information and communicate the collected historical information to the controller.

10. The machine simulation system of claim 1, wherein the analysis of the recreated past operation includes whether a machine work tool placement produced maximum loading.

11. The machine simulation system of claim 1, wherein the analysis of the recreated past operation includes whether a machine work tool movement minimized power loss.

12. The machine simulation system of claim 1, wherein the user interface is further configured to simulate operator hand movements relative to machine work tool controls inside a machine, and wherein the operator hand movements are associated with the recreated past manual operation of the machine work tool by the first operator.

13. The machine simulation system of claim 1, wherein the stored first example of operation of the machine work tool to perform the task is a recreated past operation of the machine work tool by a second operator.

14. The machine simulation system of claim 1, wherein the controller is further configured to:
    analyze the differences between the first operator's manual operation of the machine work tool and the preferred operation of the machine work tool; and
    determine whether the first operator's manual operation of the machine work tool meets efficiency criteria associated with operation of the machine work tool.

15. The machine simulation system of claim 14, wherein the controller is further configured to indicate a need for at least one of training and operator improvement based on the determination.

16. A method of improving machine operation, the method comprising:
    receiving, via a controller, historical information related to performance of a machine work tool, the machine work tool being adapted to perform at least one of loading, digging and grading at a worksite;
    recreating, via the controller, a preferred operation of the machine work tool from the received historical information;
    analyzing, via the controller, a recreated manual operation of the machine work tool by an operator for efficiency and whether an actual terrain of the worksite is compatible with a desired terrain of the worksite;
    recognizing a need for operator improvement based on the analysis of the recreated manual operation;
    training the operator to manually control the machine work tool by displaying, via a user interface, the recreated preferred operation and the recreated manual operation in a simulated environment to enable the operator to visualize differences between the recreated preferred operation and the recreated manual operation, and providing, to the operator, results of the analysis as to whether the actual terrain of the worksite is compatible with the desired terrain of the worksite; and
    subsequently, operating the machine work tool under full manual control that mimics the recreated preferred operation.

17. The method of claim 16, wherein training the operator further includes displaying onboard a machine the recreated preferred operation of the machine work tool by the operator.

18. The method of claim 16, wherein training the operator further includes displaying offboard a machine the recreated preferred operation of the machine work tool by the operator.

19. The method of claim 18, wherein displaying offboard the machine includes displaying the recreated preferred operation from a plurality of selectable reference viewpoints.

20. A machine, comprising:
   a plurality of sensing elements disposed on the machine to produce one or more signals indicative of a performance of a machine work tool, the machine work tool being adapted to perform at least one of loading, digging and grading at a worksite;
   a machine data module located on the machine to collect the one or more signals;
   a user interface configured to display a simulated environment; and
   a controller in communication with the machine data module and the user interface, the controller being configured to:
      receive historical information related to performance of the machine work tool;
      recreate a past operation of the machine work tool from the received historical information;
      analyze the recreated past operation for efficiency by comparing the recreated past operation to a historical operation previously recorded from a common machine and a common worksite and recognize a need for operator improvement based on the analysis of the recreated past operation;
      recommend a training simulation for an operator based on the recognized need for operator improvement; and
      provide to the user interface the recreated past operation, the recommended training simulation, and results of an analysis as to whether an actual terrain of the worksite is compatible with a desired terrain of the worksite for display in the simulated environment to enable the operator to visualize differences between the recreated past operation and the historical operation.

* * * * *